United States Patent [19]

Jin et al.

[11] Patent Number: 5,725,938

[45] Date of Patent: Mar. 10, 1998

[54] METALLIZATION OF CERAMIC THROUGH APPLICATION OF AN ADHERENT REDUCIBLE LAYER

[75] Inventors: Sungho Jin, Millington; David Wilfred Johnson, Jr., Bedminster; Henry Hon Law, Berkeley Heights; John Thomson, Jr., Spring Lake; Thomas Henry Tiefel, North Plainfield, all of N.J.

[73] Assignee: Lucent Technologies Inc., Murray Hill, N.J.

[21] Appl. No.: 699,515

[22] Filed: Aug. 29, 1996

Related U.S. Application Data

[63] Continuation of Ser. No. 294,696, Aug. 23, 1994, abandoned.

[51] Int. Cl.$^6$ ............................. B32B 3/00; B32B 15/00; B32B 9/06; B22F 3/00
[52] U.S. Cl. .................... 428/210; 428/432; 428/433; 428/545; 428/615; 428/450; 428/901
[58] Field of Search ........................ 428/210, 432, 428/433, 545, 615, 450, 901

[56] References Cited

U.S. PATENT DOCUMENTS

| | | | |
|---|---|---|---|
| 2,993,815 | 7/1961 | Treptow | 428/210 |
| 3,180,756 | 4/1965 | Cowan | 117/227 |
| 4,072,771 | 2/1978 | Grier, Sr. | 428/433 |
| 4,172,919 | 10/1979 | Mitchell | 428/433 |
| 4,323,483 | 4/1982 | Rellick | 252/512 |
| 4,436,785 | 3/1984 | Dietz et al. | 428/210 |
| 4,714,570 | 12/1987 | Nakatani et al. | 252/518 |
| 4,770,953 | 9/1988 | Horiguchi et al. | 428/201 |
| 4,833,004 | 5/1989 | Senda et al. | 428/210 |
| 5,063,121 | 11/1991 | Sato et al. | 428/210 |
| 5,066,620 | 11/1991 | Sunahara et al. | 428/210 |
| 5,239,744 | 8/1993 | Fleming | 29/602.1 |

FOREIGN PATENT DOCUMENTS

| | | |
|---|---|---|
| 0345870 | 12/1989 | European Pat. Off. . |
| 0586264A | 3/1994 | European Pat. Off. . |
| 03214716 | 9/1991 | Japan . |
| 06184724 | 7/1994 | Japan . |

OTHER PUBLICATIONS

D.J. Hill, et al. "Dynamic Analysis of Voltage Collapse in Power Systems". *Proceedings of the 31st IEEE Conf. on Decision and Control*, pp. 2904–2909 (19912).

Chemical Abstracts, vol. 114, No. 24, (17 Jun. 1991).

R. D. Gardner et al., "Material Science Aspects of a Thick Film Copper/Dielectric System." *Proceedings of the 1990 International Symposium on Microelectronics*, pp. 285–294, (Chicago, Oct. 15–17, 1990).

Y. Baba et al., "Co–Fireable Copper Multilayer Ceramic Substrates." *Proceedings of the 1988 International Symposium on Microelectronics*, 405–413, (Seattle, Oct. 17–19, 1988).

*Primary Examiner*—Paul J. Thibodeau
*Assistant Examiner*—Cathy F. Lam
*Attorney, Agent, or Firm*—Glen E. Books, Esq.

[57] ABSTRACT

The present invention provides improved techniques for metallizing ceramic substrates. The method comprises providing a ceramic substrate and depositing a layer of reducible material on the ceramic substrate. The layer of reducible material includes a reducible ceramic such as copper oxide. The ceramic substrate having the layer of reducible material disposed thereon is heated and the reducible material is contacted with a reducing agent to create a conductive region. The conductive region is either a metallized region formed by reduction, or it is a conductive ceramic formed through surface reduction. The present invention further provides a metallized ceramic substrate. The metallized layer comprises ceramic regions having at least one constituent in common with the ceramic substrate. The ceramic substrate and the ceramic regions of the metallized layer are sintered to each other such that the metallized region is interspersed between the sintered ceramic regions. In this fashion, the metal is firmly held to the ceramic substrate due to the presence of the bonded ceramic within the metallized layer.

9 Claims, 2 Drawing Sheets

5,725,938

METALLIZATION OF CERAMIC THROUGH APPLICATION OF AN ADHERENT REDUCIBLE LAYER

This application is a continuation of application Ser. No. 08/294,696, filed on Aug. 23, 1994, now abandoned.

FIELD OF THE INVENTION

The present invention relates to metallization of ceramics and, more particularly, to forming conductive regions on ceramic surfaces through the application of a reducible layer of material followed by a reduction treatment.

BACKGROUND

Surface metallization, especially patterned metallization, of ceramic substrate materials is important for many electrical applications such as inductors (e.g., magnetic ferrites), capacitors and piezoelectric devices (e.g., titanate ceramics), and hybrid integrated circuit (HIC) substrates (e.g., alumina). Adhesion of the metallized layer to the ceramic is critical for ensuring reliability and high performance in the resultant devices.

Generally, ceramic metallization processes fall into three categories: thin-film, thick-film, and co-firing techniques. In the thin film approach, a thin layer of metal is deposited by vacuum processes such as sputtering, evaporation, chemical vapor deposition, and laser ablation. Electroless and electrolytic plating are also frequently grouped in the thin film category. To enhance adhesion, a preliminary adhesion-promoting layer, such as chromium or titanium, is often deposited.

Thick film methods involve printing metal pastes, typically metal powders mixed with glass frits and organic binders onto ceramic substrates. The printed substrates are fired to form conductive paths on the ceramic. In the co-firing approach, unfired "green" ceramic surfaces are coated with patterned metal paste lines. The printed green ceramic is fired both to sinter the material and form the conductive metal patterns.

These processes have several disadvantages. Thin film techniques such as sputtering and electron-beam evaporation require vacuum deposition equipment. Thick film and co-firing methods generally employ precious metals such as silver and/or palladium. High temperature processing causes dimensional changes and can create stresses due to differing coefficients of thermal expansion for printed substrates containing dissimilar materials.

An alternative to the above techniques is disclosed in co-pending U.S. patent application Ser. No. 08/268,487 (Docket No. Jin 65), assigned to the instant assignee, the disclosure of which is incorporated by reference herein. In this application, the surface of a ceramic substrate is metallized through exposure to a gaseous reducing agent, such as a hydrogen-containing gas mixture. While this method provides adherent metallized regions, the ceramic substrate itself must be capable of reduction at practical temperatures, thus limiting the selection of substrate materials.

In view of the difficulties associated with conventional metallization processes, there is need in the art for simple, low-temperature processes to create conductive paths on ceramic substrates, preferably without the need to further plate a conductive layer. More particularly, there is a need in the art to create adherent metallization on ceramics to define circuit elements and magnetic component elements for electrical devices.

SUMMARY OF THE INVENTION

The present invention provides improved techniques for metallizing ceramic substrates, particularly, ceramic substrates employed in the manufacture of electrical devices. The method comprises providing a ceramic substrate and depositing a layer of reducible material on the ceramic substrate. The layer of reducible material includes a reducible ceramic such as copper oxide. The ceramic substrate having the layer of reducible material disposed thereon is heated and the reducible material is contacted with a reducing agent to create a conductive region. The conductive region is either a metallized region formed by reduction, or it is a conductive ceramic formed through surface reduction. Following the reduction treatment, the ceramic substrate is cooled.

The present invention further relates to an electrical device having a metallized ceramic portion comprising a ceramic substrate with a metallized layer disposed on the ceramic substrate. The metallized layer comprises ceramic regions having at least one constituent in common with the ceramic substrate. The ceramic substrate and the ceramic regions of the metallized layer are sintered to each other such that the metallized region is interspersed between the sintered ceramic regions. In this fashion, the metal is firmly held to the ceramic substrate due to the presence of the bonded ceramic within the metallized layer.

DETAILED DESCRIPTION

Figure 1A:
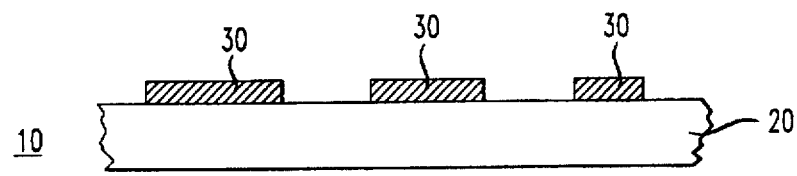
FIG. 1A is a schematic, cross-sectional view of a ceramic substrate coated with a patterned layer of reducible material.

Turning now to the drawings in detail, FIG. 1A illustrates a ceramic structure 10 comprising a ceramic substrate 20 having a patterned layer 30 of reducible material disposed thereon. As used herein, the term "substrate" encompasses any layer of ceramic material used to support the reducible material of the present invention. As such, the term "substrate" includes, but is not limited to, circuit substrates, individual layers of circuit substrates, ceramic packages, and ceramic device elements (e.g., magnetic component core materials, piezoelectric component portions). Optionally, in addition to reducible material layer 30, ceramic substrate 20 includes previously metallized regions or circuit components. Ceramic substrate 20 is selected from any ceramic material with exemplary substrates including alumina, ferrites (e.g., nickel-zinc ferrites and manganese-zinc ferrites), and silicon nitride. The ceramic substrate is provided in either the sintered or unsintered "green" state.

Reducible material layer 30 is typically applied in the form of slurry through any known technique including, but not limited to, screen printing, spray coating through a mask, and slurry ink writing. The thickness of the as-deposited layer is on the order of 0.001 to 0.050 inch. While FIG. 1A illustrates layer 30 as a patterned layer, the layer of reducible material can optionally be formed as a continuous layer on substrate 20. In addition to the reducible material, a metal-containing paste may also be printed on part of the substrate surface. This is especially desirable for layers which are to be buried inside a multilayer structure where reduction may not always be convenient.

Figure 1B:
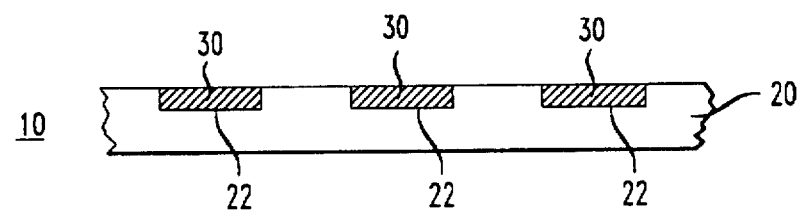
FIG. 1B is a schematic, cross-sectional view of a ceramic substrate coated with a patterned layer of reducible material.

The reducible material 30 is typically deposited on the surface of ceramic substrate 20. Alternatively, as illustrated in FIG. 1B, the reducible material 30 is deposited within recessed portions 22 of substrate 20. Such recessed portions are formed in an exemplary embodiment through multilayer ceramic processing techniques by forming apertured ceramic layers corresponding to recessed portion 22 and laminating these layers with continuous ceramic layers in the green state to create the substrate. Advantageously, the configuration of FIG. 1B results in a metallized substrate having a planar surface.

Figure 2A:
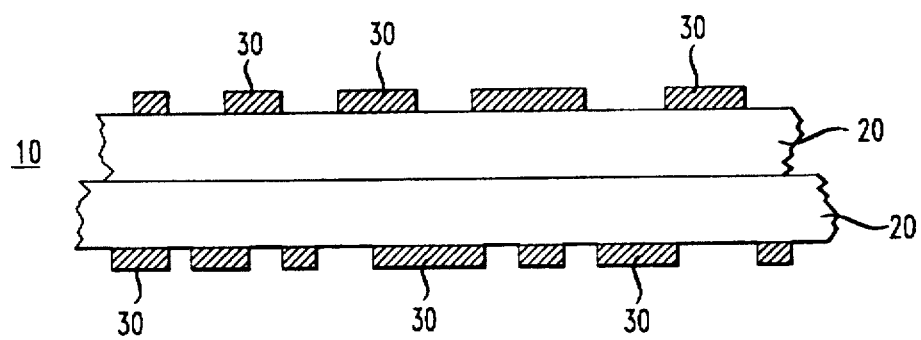
FIG. 2A is a schematic, cross-sectional view of a multi-layer ceramic structure with reducible material applied on two exterior surfaces.
Figure 2B:
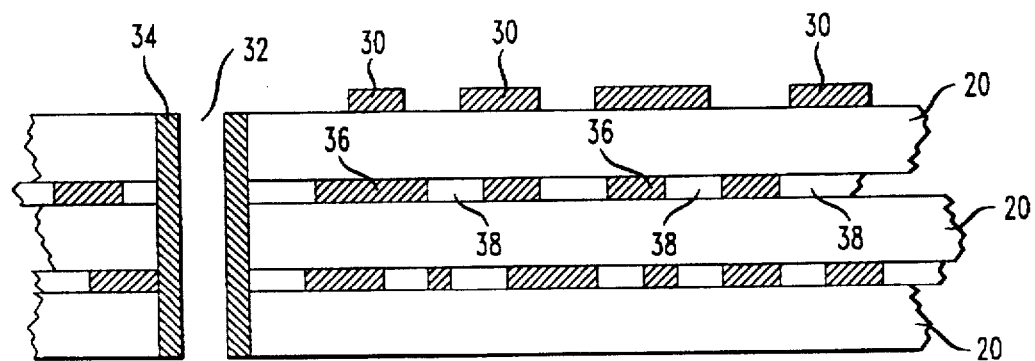
FIG. 2B is a schematic, cross-sectional view of a multi-layer ceramic structure with reducible material applied on a surface, in a via hole, and in interior layers.

As illustrated in FIG. 2A, a configuration of reducible material is used to form multilayer ceramic structures. In FIG. 2A, the reducible material 30 creates patterned exterior surfaces. The structure of FIG. 2A is formed through the lamination of two substrate layers 20. As shown in FIG. 2B, lamination of plural layers creates more complex multilayer ceramic structures. In the structure of FIG. 2B, a via hole conducting path 34 is produced by coating the interior of aperture 32 with reducible material 30. Buried conductors 36 are created by forming surface patterns from the reducible material or from conductive metal pastes. Following lamination of the individual patterned layers, gaps 38 remain, permitting gaseous reducing agents to penetrate through the multilayer structure. The ceramic structures of FIG. 2A and 2B can be constructed in accordance with multilayer ceramic processing techniques such as those of U.S. Pat. No. 5,239,744, the disclosure of which is incorporated herein by reference.

The reducible material is generally formed as slurry comprising reducible ceramic powder, binder, and carrier liquid. The reducible ceramic powder comprises a ceramic material, typically an oxide, which is preferentially reducible over the material of the ceramic substrate. Exemplary reducible ceramic powders include copper oxides such as CuO and nickel oxides such as NiO. Slurries including copper oxide on alumina substrates are exemplary reducible material/substrate systems. The reducible material can also be selected from multicomponent (e.g., binary, ternary, or higher order) ceramic materials in which one or more constituents are reducible. Although the reducible layer is generally a reducible ceramic slurry, it is noted that any material which is preferentially reducible over the ceramic substrate can be applied as layer 30 in any convenient form.

To improve the adhesion of layer 30 to ceramic substrate 20, a mixed ceramic slurry is employed comprising both the reducible ceramic powder and a nonreducible ceramic powder. By "nonreducible" it is meant that the powder remains essentially as a ceramic (approximately greater than 90% by volume) when the reducible ceramic powder is reduced to metal or to a conductive ceramic (approximately greater than 50% volume) for a given temperature and time. To further enhance adhesion of the layer 30 to the substrate, the nonreducible ceramic powder is selected to include at least one component of the substrate ceramic. For example, if an alumina substrate is to be metallized, the reducible material layer is formed from a slurry which includes $Al_2O_3$ powder as well as a reducible ceramic powder such as NiO or CuO. When using a multicomponent ceramic substrate such as nickel-zinc ferrite, the reducible material includes, along with the reducible ceramic powder, either the nickel-zinc ferrite powder itself or any combination of the constituents: $Fe_2O_3$, NiO, and ZnO.

The amount of nonreducible ceramic powder employed in reducible layer 30 is adjusted by decreasing the amount of reducible ceramic powder. When desiring to produce high conductivity in layer 30, a larger volume of reducible ceramic powder is employed while for enhanced adhesion, a higher volume of nonreducible ceramic is used. If a high conductivity metal layer such as copper or nickel is to be further deposited upon layer 30, larger amounts of nonreducible ceramic material can be employed. An exemplary amount of nonreducible ceramic used in layer 30 is in the range of 5–70% by volume, typically 20–50% by volume.

By using a slurry which includes a nonreducible ceramic material, particularly a substrate component material, layer 30 is more adherently bonded to the substrate through the affinity of the substrate component material for the substrate. The structure produced by the fired and reduced slurry layer includes ceramic regions sintered to the substrate material with metallized regions interspersed between the sintered ceramic regions. The metal is firmly held to the substrate due to the presence of bonded ceramic regions having an irregular configuration, thereby providing a large surface area for metal adhesion.

Use of a non-reducible ceramic powder having a composition the same as or similar to that of the substrate is particularly advantageous since there is minimal danger of affecting the substrate composition during heating, e.g., by interdiffusion of the layers. Additionally, stresses due to mismatched coefficients of thermal expansion for dissimilar materials are minimized for such layer combinations.

Following deposition of layer 30, the ceramic structure 10 is heated. When layer 30 is formed from a slurry, the heating partially or fully sinters the ceramic powders. Heating is generally carried out at a temperature higher than a homologous temperature of approximately 0.7 of the melting temperature of the ceramic substrate material. By "homologous melting temperature" it is meant the melting temperature of the ceramic material in Kelvins. For many ceramic materials used in electronic applications, this translates to a range of approximately 800°–1600° C. When substrate 20 is provided in the green state and layer 30 is a ceramic slurry, the degree of sintering should be sufficient to densify the substrate and layer 30 but insufficient to cause excessive mixing of layer 30 and substrate 20. Sintering times are determined experimentally since they are dependent upon the process conditions (e.g., temperature) and material combinations of layers 20 and 30 as well as the particle size, volume fraction of binder, and other material properties of the substrate and the reducible material layer.

The sintering process bonds the ceramic slurry layer 30 to ceramic substrate 20. To render layer 30 conductive, a reduction treatment is performed by contacting layer 30 with a gaseous reducing agent. Exemplary reducing agents are gaseous reducing agents including, but not limited to, hydrogen, forming gas (a mixture of hydrogen and nitrogen or hydrogen and an inert gas), ammonia, mixtures of hydrogen and $H_2O$, and mixtures of carbon monoxide and carbon dioxide. Advantageously, by using the latter two mixtures, the partial pressure of oxygen (as removed from the reducible material layer) can be precisely regulated, enabling greater control of the reduction process.

Depending upon the material selected for the reducible material layer and the conditions of the reducing treatment, the reducible material is made conductive either by conversion to metal or to a conductive non-metallic material such as a conductive ceramic.

Because different materials have different thermodynamics and kinetics of reduction in various reducing environments, the time, temperature and composition of the reducing agent is determined experimentally. When layer 30 is formed on a $Ni_{0.4}Zn_{0.6}Fe_{2.0}O_4$ substrate from a ceramic slurry employing CuO as the reducible material with nickel-zinc ferrite (NiO, $Fe_2O_3$, and ZnO) as the substrate component materials, a reduction treatment in flowing hydrogen at 250°–300° C. for 0.5 to 2 hours is sufficient to substantially reduce the CuO to metallic copper. Since the rate of reduction of the nickel-zinc ferrite is much lower, the nickel-zinc ferrite adhesion-promoting material, and the nickel-zinc ferrite substrate to which it is sintered, are substantially unaffected. Reduction is performed until layer 30 has an electrical resistivity of below 5000 micro-ohm-cm, with resistivities of below 200 micro-ohm-cm and below 10 micro-ohm-cm being exemplary. The conductivity of the as-reduced layer can be made to be sufficiently high for use as circuit metallization without the need for further plating of conductive metals.

Figure 3:
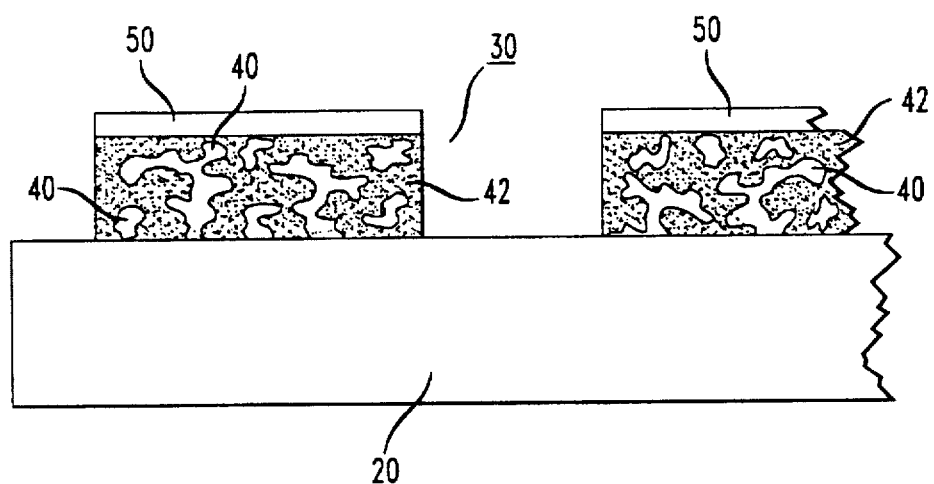
FIG. 3 is a schematic, cross-sectional view of an adherent metallization structure following reduction treatment.

FIG. 3 schematically illustrates the metallized structure formed from the CuO-nickel-zinc ferrite slurry/nickel-zinc ferrite ceramic structure following hydrogen reduction. Within layer 30 are regions 40 of sintered nickel-zinc ferrite, portions of which are sintered to nickel-zinc ferrite substrate 20. Regions 42 are copper metal formed by the reduction of CuO. The irregular surfaces provided by sintered nickel-zinc ferrite regions 40 provide substructure to firmly adhere copper regions 42 to substrate 30.

Following the reduction treatment, a further layer of metal plating is optionally performed on layer 30. This is particularly desirable when the reduction process has been used to render layer 30 conductive, but has not completely metallized the reducible material. Metal plating is also desirable when using a slowly reducing material as the reducible ceramic or when large amounts of current must be carried by the metallization. In this metal plating process, a layer of high conductivity metal such as copper or nickel is deposited, depicted as layer 50 in FIG. 3. Because layer 30 is rendered conductive through the reduction treatment, metal deposition can be performed using electroplating. Chemical methods such as electroless deposition are also used to form layer 50. Optionally, during metal plating, some portions of layer 30 can be blocked from deposition through appropriate techniques.

Figure 4:
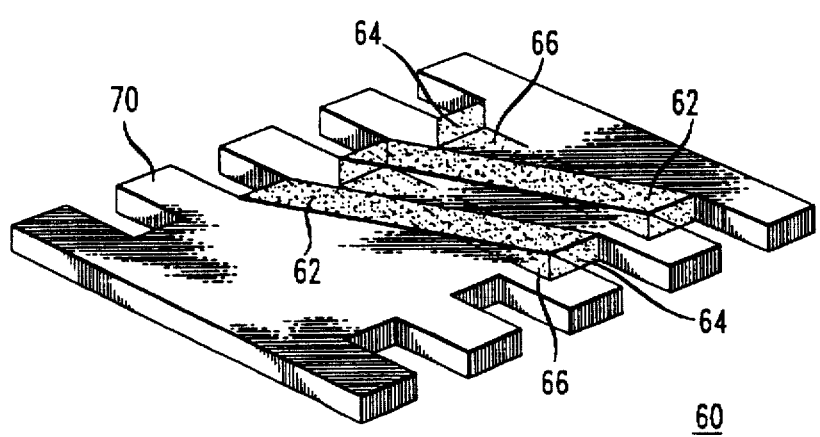
FIG. 4 is a perspective view of a ferrite inductor having a helical inductor path formed according to the present invention.

The processes of the present invention are used in the formation of a variety of electrical devices. Exemplary applications include circuit path metallization for planar and three-dimensional configurations. A three-dimensional inductor metallization structure is illustrated in FIG. 4. Inductor 60 is formed from a helical winding comprising top and bottom winding portions 62 and 66 and side winding portions 64. The helical winding surrounds a portion of the ferrite substrate 70 which acts as the inductor core. A CuO/ferrite slurry is used to form the helical winding by screen-printing, spray coating through a mask, or ink writing on each of the four sides to form the coil portions.

The inventive methods can also be used to form a ferrite power module structure as described in co-pending U.S. application Ser. No. 08/268,465 to Fleming et al. (Docket No. Fleming 8) the disclosure of which is incorporated by reference herein. In this application, the ferrite substrate, in addition to forming the core for magnetic components such as inductors and transformers, acts as a substrate for other circuit elements of a power module, substantially reducing the profile of the device.

While the foregoing invention has been described in term of the above detailed embodiments, it will be readily apparent to those skilled in the an that various additions and changes can be made. Accordingly, modifications such as those suggested above, but not limited thereto, are considered to be within the scope of the claimed invention.

What is claimed is:

1. An electrical device including a metallized portion comprising:

a ceramic substrate; and a metallized layer disposed on the ceramic substrate, the metallized layer including metallic regions and ceramic regions, the ceramic regions having at least one constituent in common with the ceramic substrate, the metallic and ceramic regions formed from a mixture comprising a reducible ceramic material which forms the metallic regions and a nonreducible ceramic material which forms the ceramic regions, the nonreducible ceramic material being used in an amount ranging from between 20% to 50% by volume of the mixture, the ceramic substrate and at least a portion of the ceramic regions of the metallized layer being sintered to each other such that the sintered ceramic regions are interspersed between metallic regions of the metallized layer.

2. An electrical device including a metallized portion according to claim 1 further comprising:

a metal layer disposed on said metallized layer.

3. An electrical device including a metallized portion according to claim 2 wherein the metal layer is formed by electroplating.

4. An electrical device including a metallized portion according to claim 2 wherein the metal layer is formed by electroless deposition.

5. An electrical device according to claim 1 wherein a particular pattern of the metallized layer disposed on at least one surface of the substrate forms windings of a component selected from inductors and transformers.

6. An electrical device according to claim 1 wherein the metallic regions of the metallized layer contain copper.

7. An electrical device according to claim 1 wherein the ceramic substrate is copper oxide.

8. An electrical device according to claim 1 wherein the ceramic substrate is a magnetic ferrite.

9. An electrical device according to claim 1 wherein the ceramic substrate is aluminum oxide.

* * * * *